(12) United States Patent
Chai

(10) Patent No.: US 6,175,808 B1
(45) Date of Patent: Jan. 16, 2001

(54) LIGHTNING EFFECTS MONITORING AND RETEST EVALUATION METHOD

(75) Inventor: Jason Checksen Chai, Manhattan Beach, CA (US)

(73) Assignee: The Aerospace Corporation, El Segundo, CA (US)

(*) Notice: Under 35 U.S.C. 154(b), the term of this patent shall be extended for 0 days.

(21) Appl. No.: 09/253,173

(22) Filed: Feb. 19, 1999

(51) Int. Cl.[7] .................................................. G06F 15/54
(52) U.S. Cl. ............................................... 702/4; 324/72
(58) Field of Search ....................... 324/72; 702/4, 702/6

(56) References Cited

U.S. PATENT DOCUMENTS

| | | | |
|---|---|---|---|
| 4,672,305 | * 6/1987 | Coleman | 324/72 |
| 5,251,286 | * 10/1993 | Wiener et al. | 395/22 |
| 5,299,127 | * 3/1994 | Stevens, Jr. et al. | 702/4 |
| 5,528,494 | * 6/1996 | Moses | 702/4 |
| 5,537,318 | * 7/1996 | Moses et al. | 702/4 |
| 5,771,020 | * 6/1998 | Markson et al. | 324/72 |
| 5,886,528 | * 3/1999 | Perry | 324/457 |
| 5,892,363 | * 4/1999 | Roman | 324/452 |
| 5,903,220 | * 5/1999 | Jon et al. | 340/600 |
| 5,959,815 | * 9/1999 | Gilbert | 361/1 |
| 5,977,762 | * 11/1999 | Murtha, Jr. et al. | 324/72 |

* cited by examiner

*Primary Examiner*—Christine Oda
*Assistant Examiner*—Victor J. Taylor
(74) *Attorney, Agent, or Firm*—Derrick Michael Reid

(57) ABSTRACT

An evaluation system and retest method uses essential coupling physics of lightning, monitored system geometries, and on-line sensor readings for generating and comparing monitored retest indices to critical retest indices using a retest chain algorithm using pre-launch analyses to then provide real-time retest decisions for spacecraft launch operations following major lightning storms.

9 Claims, 4 Drawing Sheets

RETEST ALGORITHM

LIGHTNING MONITORING SYSTEM

FIG. 1

SENSOR STRESS AND STRENGTH GRAPH

| |
|---|
| Range variables for Retest Criterion, with N = 3 monitor readings. <br> 110  N = 3  number of monitors <br> i = 1, 2.. N  monitor index |
| Maximum monitor readings from corresponding pre-launch full-threat case analyses <br> $MAX_1 = 1930$  Amps from the current probe <br> 131  $MAX_2 = 300000$  V/m from the Eside-field sensor  $MAX_i$ <br> $MAX_3 = 350000$  V/m from the Erop-field sensor |
| Updated channel weights. <br> 132  $W_1 = 0.63$  $W_2 = 0.11$  $W_3 = 0.26$  $W_i$ |
| Calculation composite monitor retest Index on an arbitrarily chosen scale of 10, based on monitor readings. <br> 133  $MRI_i = \left(\dfrac{M_i}{MAX_i} \cdot 10\right) \cdot W_i$  $M_1 = 879$  $M_2 = 2200$  $M_3 = 144000$ |
| Composite Monitor Retest Index <br> $MRI_1 = 2.864$  $MRI_2 = 0.008$  $MRI_3 = 1.070$  $MRI = \sum MRI_i = 3.94$  134 |
| Critical Retest Indices $CRI_i$ from intercepts of stress curves with the strength line, obtained from pre-launch analyses, mapped to weight index axis of 10-scale with respective selected safety margins (SM). <br> SM = 0dB  SM = 6dB  SM = 12dB  SM = 20dB <br> $CRI_1 = 7.4$  $CRI_1 = 3.8$  $CRI_1 = 2.0$  $CRI_1 = 0.5$ <br> 135  $CRI_2 = 5.7$  $CRI_2 = 4.2$  $CRI_2 = 3.0$  $CRI_2 = 1.8$ <br> $CRI_3 = 6.3$  $CRI_3 = 3.0$  $CRI_3 = 1.8$  $CRI_3 = 0.9$ |
| Composite Critical Retest Index is CRI from the intercept of the combined stress curve with the strength line with a desired SM from pre-launch susceptibility analyses. <br> CRI = 6.467  CRI = 3.667  CRI = 2.267  CRI = 1.067  146 |
| Retest Decision based on MRI > CRI? <br> SM = 0dB  MRI = 3.94 < 6.467 no retest <br> SM = 6dB  MRI = 3.94 > 3.667 retest <br> 150  SM = 12dB  MRI = 3.94 > 2.267 retest <br> SM = 20dB  MRI = 3.94 > 1.067 retest |

MATHCAD CHAIN ALGORITHM RETEST PROCESS

FIG. 4

LIGHTNING EFFECTS MONITORING AND RETEST EVALUATION METHOD

STATEMENT OF GOVERNMENT INTEREST

The invention was made with Government support under contract No. F04701-93-C-0094 by the Department of the Air Force. The Government has certain rights in the invention.

FIELD OF THE INVENTION

The invention relates to the field of lightning-induced transients monitoring. More particularly the invention relates to sensory input processing for the detection of potentially damaging lightning strikes on various systems.

BACKGROUND OF THE INVENTION

Launching space vehicles into space from locations of high frequency of lightning strikes, such as in Florida, presents a recurring problem and concern of the potential lightning induced damage to the space vehicles and payload systems prior to launch. This concern is especially acute for launches taking place during the high lightning season in the summer months. Those involved in the actual launch activities must account for the chaotic atmosphere particularly when a nearby lightning strike has been reported during the critical time path just before a launch. Currently, the assessment of the potential damage to the launch and space vehicle mainly depends on limited and primitive means. The entire launch vehicle including the payload, space vehicle, and an upper stage, if required, are subject to precautions offering modest protection against lightning, often without accurate knowledge of the threat. The decision to proceed with normal launch activities or to switch to retest and re-certification procedures is a difficult one which is subject to conjecture and often results in over-testing or under-testing. As more and more sensitive devices are used in the space vehicles and in order to achieve a balance between too much retest and too little retest, a more reliable lightning retest criterion to help make a real-time decision is needed. The purpose of such a criterion is, on the one hand, to avoid unnecessary and costly tests and delays, and on the other hand, to avoid launching damaged or degraded vehicles and payloads into space.

In order to effectively protect against lightning-induced electromagnetic effects, it is prudent to monitor and then protect selected lines and devices. There are two types of known lightning monitoring systems. One type of monitoring system is a remote off-line sensing system that measures the lightning current in the distant lightning channel. Another type of monitoring system is a proximal on-line monitoring system that measures direct parameters that stress the launch system and payload. One on-line monitoring system is the transient pulse monitoring system and has been used during Air Force launches. The proximal on-line monitoring system supports real-time launch operations. Ideally, the on-line monitoring system should be able to provide readings at as many sensor locations as needed. The initial placement of the sensors is guided by analyses for severe field points, that is, major entry points for lightning energies along critical and sensitive penetration paths. The present transient pulse monitoring system can only provide readings at six locations external to the space vehicle. High and low limits for sensors are used to start printed recorders or to alert the launch director based on external stress estimates that need to be refined to correlate with the internal stress at the circuit level. Flow-down analyses are needed to propagate the external stress to the internal circuits, followed by circuit coupling analysis and susceptibility analysis. Ideally, some internal circuit lines can be monitored to provide direct readings at the circuit level eliminating some of the simplifying assumptions and uncertainties in the mathematical models of the analyses. The present transient pulse monitoring system provides three types of stress readings including sheath current readings on the umbilical cable reading, electric field readings on selected surfaces, and magnetic field readings above the umbilical cable. Each type of reading presents a different mode of entry for the lightning energy coupled into the space vehicle system. These readings must be coordinated to give a combined indication of the stress at the circuit level.

The present Launch Range-operated cloud-to-ground lightning surveillance system is a remote sensing system. While it is valuable for general weather forecast purposes, it provides only indirect cloud-to-ground data of unspecified effects on the system circuits. To translate the distant environmental lightning data into system-specific stress data, many contractors at the present time rely on analyses that are quasi-static and back-of-the-envelope types of estimates for simple, now-obsolete launch configurations. Other existing monitoring systems are even more primitive having low fidelity and resulting in low confidence level information about lightning-induced transients that have resulted in many unnecessary retests and delays. Recent events have made many contractors aware of these limitations, and have moved them to use the proximal on-line monitoring system, and to re-examine their retest criteria.

The existing proximal on-line lightning monitoring systems use either analog or digital technology for detection and data processing. Currently two types of direct on-line lightning monitoring systems have been fielded. An analog type system, such as the transient pulse monitoring system, performs analog peak detection during continuous monitoring of lightning-induced transients. The digital monitoring system provides detailed waveform information of the transients. When deployed alone, the analog monitoring system gives no actual waveforms, while the digital monitoring system may miss significant events due to sampling limitations. The analog monitoring offers continuous front-end monitoring but lacks the actual waveform details that are needed and used by many contractors. It should be advantageous and cost-effective to combine these analog and digital systems into one integrated hybrid system that would avoid these shortfalls.

A correct determination of a Go and No-Go evaluation is vital to the launch operation that has obvious consequences on mission success. An efficient and effective retest algorithm is desired. The present-day algorithms used by contractors are based on the Boolean logic, indirect parameters, and inadequate measurements that often result in over-testing or under-testing. Over-testing leads to unnecessary delays, higher cost, and schedule impacts, while under-testing is dangerous because damage may not be discovered, resulting in the launch of a defective vehicle into space where no repair is feasible. Under-testing is most dangerous in that damage will not be discovered and damaged vehicles may be launched.

The miniaturization of electronic devices makes the launch system more sensitive and vulnerable to lightning-induced electromagnetic transients. Therefore, many systems have implemented procedures, often called lightning retest criteria or lightning damage search criteria for their launch processing operations following major lightning storms. Many existing lightning retest criteria and lightning damage search criteria are based on indirect parameters. This results in simplistic, misleading and erroneous retest decisions. During the critical moments shortly before launch, little time is allowed for detailed and elaborate analysis of the situation that may arise due to lightning events. However, many complicated analyses are generic processes that can be performed well in advance of a launch, and the analytical results with appropriate system configurations can be incorporated into the lightning effects evaluation algorithm in the form of lookup data tables.

Instead of waiting for nature to deliver all types of lightning over a long period of time, parametric studies using mathematical models can be carried out to analyze many possible scenarios. Three kinds of analyses are needed to support the formulation of a dependable lightning retest evaluation method. The three kinds of analyses are electromagnetic (EM) field coupling analysis, circuit coupling analysis, and susceptibility analysis. These analyses can be performed during pre-launch periods.

Field coupling analysis is an EM field coupling analysis that is based on the scattering theory in terms of Maxwell equations and is used to characterize the induced electromagnetic transients on the segments in the model space due to lightning-generated electromagnetic fields. Because of the complexity of the structures and geometry, a method of moments computer code or a finite difference computer code is needed to S incorporate essential geometry and physics into the analysis. Analysis results provide the stress drivers from any selected location for the stress evaluation of identified circuits and devices in a later circuit analysis. Each structure is segmented to represent locations where the responses can be monitored.

Circuit analysis is a coupling analysis that determines the most likely entry point of lightning energy. Critical circuits or devices for a particular space system must be first identified. The stresses induced by lightning on the circuits and devices in the system will be evaluated. Circuit models for these circuits will be built for a circuit analysis code such as the industry standard code named SPICE using the location drivers from the EM field coupling analysis. The SPICE code evolved from the research project at UC Berkeley and is available commercially in many versions. The SPICE code remains a powerful circuit analysis tool for electrical circuits. The outputs of the circuit analysis are stress energies coupled into the circuits. Stress energy ratios for different location drivers provide initial individual sensor channel weights. The weights with drivers of various severity will also yield a stress profile as a stress curve in energy versus a sensor reading for a particular circuit at a given location.

Susceptibility analysis of the space system will determine the susceptibility of the system to energy stresses. A Wunch-Bell type of damage mechanism is usually used in the damage assessment. The Wunch-Bell model for damage and its applications can be found in the public literature and is well known by those skilled in the art of lightning testing. This susceptibility analysis will yield threshold energies that cause damage to the circuits. The susceptibility analysis aids in the identification of sensitive circuits or devices in the system. Electric field sensor readings inside known layers of enclosures can be compared to a Fourier transform, in the time domain, of an analytical Electric field prediction for determining a certain threat level. Other points can also be found for less severe threat levels to obtain the shape for the Electric sensor stress curve. Without performing the susceptibility analysis for the circuits, this stress curve only defines a generic shape for an allowable electric field stress level. This generic stress curve lacks the details and the characteristics of the selected circuits and, therefore, the susceptibility analysis should be circuit specific for generating suitable strength levels. The threshold energy for the most sensitive circuits or devices will provide a strength line. Certain safety margins, e.g. 6 dB, are required for many electromagnetic compatibility considerations and can be built-in by moving the strength line downwards on the retest plot thereby providing safety margins desired for the decision-making process.

As micro-technology advances, miniature probes and sensors may become available to allow closer placement of the probes and sensors to circuits and devices of interest reducing the need for circuit analyses. Because there is no a priori knowledge about the next lightning event and the general topology of launch platforms, it is necessary to deploy multiple sensors to cover all possible entry points of lightning energies. Multiple sensor deployment increases confidence levels of detection by confirming significant events and by discarding spurious events through correlated multiple sensor inputs.

A lightning retest criterion should include all the important parameters that affect the system under lightning monitoring. The first parameter is the stress induced by lightning on the system, and the second parameter is the intrinsic strength of the system to withstand the stress without suffering damage. Lightning, by virtue of transient electromagnetic field scattering from the system, will first induce electromagnetic stresses on the external surface of the system such as the payload faring and umbilical cable sheath. The external stress, in terms of induced electromagnetic fields or currents on the surface of the system will then propagate through available paths to the circuits and devices in the interior, and discharge undesirable energy there causing damage. A validated transient pulse monitoring system as installed for a particular payload will give the actual external stress, and analyses will indicate the effect of the external stress over a wide range of lightning threats. The stress at circuit levels is the true reason for damage concerns, and stress is stated in terms of stress energy and voltage waveforms by circuit coupling analyses.

However, stress alone will not indicate whether or not the circuit will be damaged. The strength, that is, the tolerance, of the circuit is determined by the susceptibility analysis. A comparison of the stress and strength in the susceptibility analysis yields an indication of how well the circuit will tolerate a given stress. A retest criterion can then be formulated with desired safety margins. Even if the stress is very severe, a circuit that has strength to withstand that stress should not be damaged. The strength of a device or circuit is an intrinsic characteristic of such a device or circuit. A good example of the strength of a device or circuit is the burn-out damage threshold. Abundant experimental data is available for various types of devices such as diodes, transistors, digital circuits, and other basic electronic components. This data has been fitted to the Wunch-Bell-Jenkins-Durgin empirical failure models. A conservative sample burn-out damage energy threshold is one micro-joule for many popular sensitive electronic devices.

The historical account has shown that the present monitoring systems are inadequate in detecting lightning-induced transients, and the retest criteria produce decisions subject to conjecture and results in over-testing or under-testing. As more and more sensitive devices are used in launch and space vehicles and other electronic systems, a more reliable lightning effects monitoring and retest evaluation method is needed. The inadequacies and other disadvantages of the present monitoring systems can be solved or reduced using the present invention.

SUMMARY OF THE INVENTION

An object of the invention is to provide an evaluation method of determining when a lightning event warrants a costly retest of the target system.

Another object of the invention is to provide a hybrid on-line monitoring system that combines analog and digital technologies for the monitoring of lightning-induced electromagnetic transients that can possibly damage the target system being monitored.

The invention is directed to assisting in the evaluations of the effects that lightning-induced electromagnetic transients have on launch systems during space launch operations. The invention is a lightning-induced electromagnetic effects evaluation and monitoring system and method that combines the advantages of both analog and digital technologies, while avoiding the shortfalls of each if either is applied alone. This monitoring system will be driven by a retest algorithm that incorporates the correct interaction physics and essential launch geometries, by utilizing multiple sensor data that is statistically weighed and evolves in a dynamic manner. The retest algorithm output will be an evaluation of the lightning-induced threat from which a real-time recommendation on Go and No-Go decision can be made. The on-line monitoring system comprises a multiple-sensor suite, a characterizer, a responder, and a detailer. The sensor suite consists of multiple sensors of various types such as current probes, electric and magnetic field sensors and voltage probes. These sensors detect the lightning-induced electromagnetic transients and provide the sensory inputs to the rest of the monitoring system. The characterizer is made up of a number of peak detectors that take the signals from the sensors and perform necessary functions to condition and characterize the sensor signals. Only those signals exceeding a preset threshold will be sent to trigger the detailer where they will be digitized and displayed in suitable forms. These characterized sensor signals are then communicated to the responder that consists of A/D converters and a microprocessor to capture data and a computer to further analyze the data using the retest algorithm.

The software of the system consists of commercial data handling and analysis software and the novel retest algorithm for real-time threat evaluations for launch decisions. The retest algorithm integrates results from extensive electromagnetic (EM) field coupling analyses, circuit analyses, and susceptibility analyses, and can be updated using a database of data collected from the multiple sensor suite. The retest algorithm utilizes innovative retest indices of monitor readings to correlate the multiple sensor data that can be compared to a critical retest index of a predefined damage strength threshold to identify the subsystem most likely to be affected for repair and retest purposes to arrive at a Go or No-Go determination recommendation.

Two sets of indices are used. A set of monitoring retest indices MRI indicate monitored stress. A set of critical retest indices CRI indicate critical stress levels that when exceeded by monitored stresses presents a potential retest situation. The susceptibility analysis and circuit analysis provide the stress curves and the strength lines, with or without safety margins, for sensitive circuits forming a stress curve graph having intercepts indicating the individual critical retest indices $CRI_i$. The composite critical retest index CRI is preferably computed from the average of the individual $CRI_i$. Critical retest indices $CRI_i$ are determined and used to indicate the threshold events at which potential damage can occur. This determination is based on the stress curves and the circuit damage threshold energy levels, with or without safety margins. Each $CRI_i$ is obtained at the point where the stress curve crosses a horizontal threshold strength level. A safety margin may be used to lower the strength level to define the intercept with the stress curve at a safer level. The monitor retest indices $MRI_i$ represent the actual stress experienced by selected circuits for each of the N monitor sensor readings, where the sensor index i is equal to one to N. The retest monitoring indices MRI are computed from monitor readings $M_i$ and channel weights $W_i$ indicating what fraction of energy is coupled to the respective circuit. The channel weights $W_i$ are derived from the circuit coupling analysis. A composite monitor retest index MRI is preferably calculated by the sum of the individual $MRI_i$. The retest algorithm then performs a comparison of the composite MRI and CRI indices for a retest recommendation. Equal weights for damage are assumed once the energy from a strike reaches the circuit. Depending on a particular space vehicle, various stress curves with threshold strength levels can be obtained for various types of circuits and devices. The combined composite retest index MRI of the monitor readings is determined for a particular event and is preferably compared to a composite critical retest index CRI. Further, individual $MRI_i$ indices can be compared to respective individual $CRI_i$ indices for each sensor and respective circuit for respective retest recommendations. The $CRI_i$ indices are determined from pre-launch analyses whereas the $MRI_i$ indices are computed during a lightning event.

The retest algorithm is applicable to space vehicle or structures using monitored sensor data. For space vehicles, pre-launch, coupling analysis is performed for respective launch vehicular configurations. That is, susceptibility and circuit analyses are performed in advance of on-line monitoring. Circuit analysis results and databases are used in the retest algorithm to update the individual channel weight $W_i$ as new data is accumulated. The real-time on-line monitoring system provide monitor readings $M_i$ that are immediate inputs to the retest algorithm for computing in real time the monitor retest indices $MRI_i$ using channel weights $W_i$ computed from the circuit analysis. The retest algorithm adopts a balanced intermediate approach where fractional weighted indices $W_i$ from the circuit analysis are used to compute the individual $MRI_i$ for of all identified coupling modes of lightning coupling reflecting the physical interrelationship of the vehicle and the lightning points of entry.

The lightning retest criterion contains essential physics of lightning and geometry of the system. It also correlates all sensors readings into a simple rule of comparison using the concept of retest indices. Therefore, the retest algorithm provides an instantaneous means for real-time decisions following lightning storms. The retest criterion is based on the family of stress curves that are expressed in terms of stress energy obtained from analyses and monitor readings from a high-fidelity on-line lightning monitoring system. The measurements will be taken by the hybrid on-line lightning monitoring system that uses both analog and digital sensory inputs. The lightning retest criterion is well suited for space launch processing operations, but can be applied to other systems. There are broad potential markets for the monitoring system wherever lightning is a concern, such as communication systems, control and command centers, railroad stations, as well as factories, storage or office buildings.

The retest algorithm for a lightning retest criterion uses pre-launch analysis and high-fidelity on-line measurements.

The retest algorithm correlates multi-sensor data with correct interaction physics for complex launch pad structures and geometries. The retest algorithm correlates multi-sensor data to achieve cost and risk reduction for space launch operations. Using the data collected by the hybrid on-line monitoring system, it provides a credible, real-time retest decision-making tool for evaluating electromagnetic effects induced by major lightning storms. Pre-launch analyses such as EM field coupling analysis, the circuit analysis, and the susceptibility analysis, are updated and coordinated with real-time multiple sensor measurements on the launch pad. This information is combined in a weighted manner in the retest algorithm.

The hybrid on-line lightning effects monitoring system combines the desirable features of both analog and digital systems. The system provides continuous analog monitoring and digital waveform recording. This monitoring system is designed to be generic enough for all space vehicles at all launch pads, yet is flexible enough to accommodate specific needs of a particular launch configuration. After implementation, the monitoring system can be operated and maintained by the Launch Range Authority. The comprehensive suite of sensors for a baseline design in the monitoring system will keep a vigil watch for on-line transients because of the importance not to miss any event usable for damage assessments, while only selected channels are digitized to give waveform information for verification of significant events. The number, type, and placement of sensors are determined from analyses and field experiences. Most of the current and voltage probes and electromagnetic field sensors are placed at fixed, identified entry points while the remainder of the sensors is deployed throughout the launch pad for launch-specific and reference purposes. The real-time on-line measurements are used in two ways. Inputs to the monitoring system are used for the real-time updates of the individual monitor retest indices MRIi. The inputs to the database are used for iterative updates of the individual channel weights for later use. In this way, the dynamic updated characterization of the space vehicle susceptibility and on-line monitoring is achieved.

The monitoring system and method offers continuous monitoring of lightning-induced electromagnetic effects on selected locations, with actual selectable waveform detail information at pre-set levels, offers the correlation of multiple channel on-line data, offers the combination of correct interaction physics with realistic system geometry, offers minimal real-time user inputs and data processing, offers provision of flexibility for different system configurations and future expansion, offers unification of compartmentalized subsystem circuits, and offers utilization of real-time decisions with any desired safety margin. These features facilitate both short-term and long-term cost and risk reductions of space launch operations. The retest algorithm is almost instantaneous, and decisions can be made in real time when launch operations are in progress. The space vehicle contractors will also have the information for different types of circuits, such as individual MRIi and CRIi enabling the contractors to identify particular circuits or devices needing retest or repair. These and other advantages will become more apparent from the following detailed description of the preferred embodiment.

DETAILED DESCRIPTION OF THE PREFERRED EMBODIMENT

Figure 1:
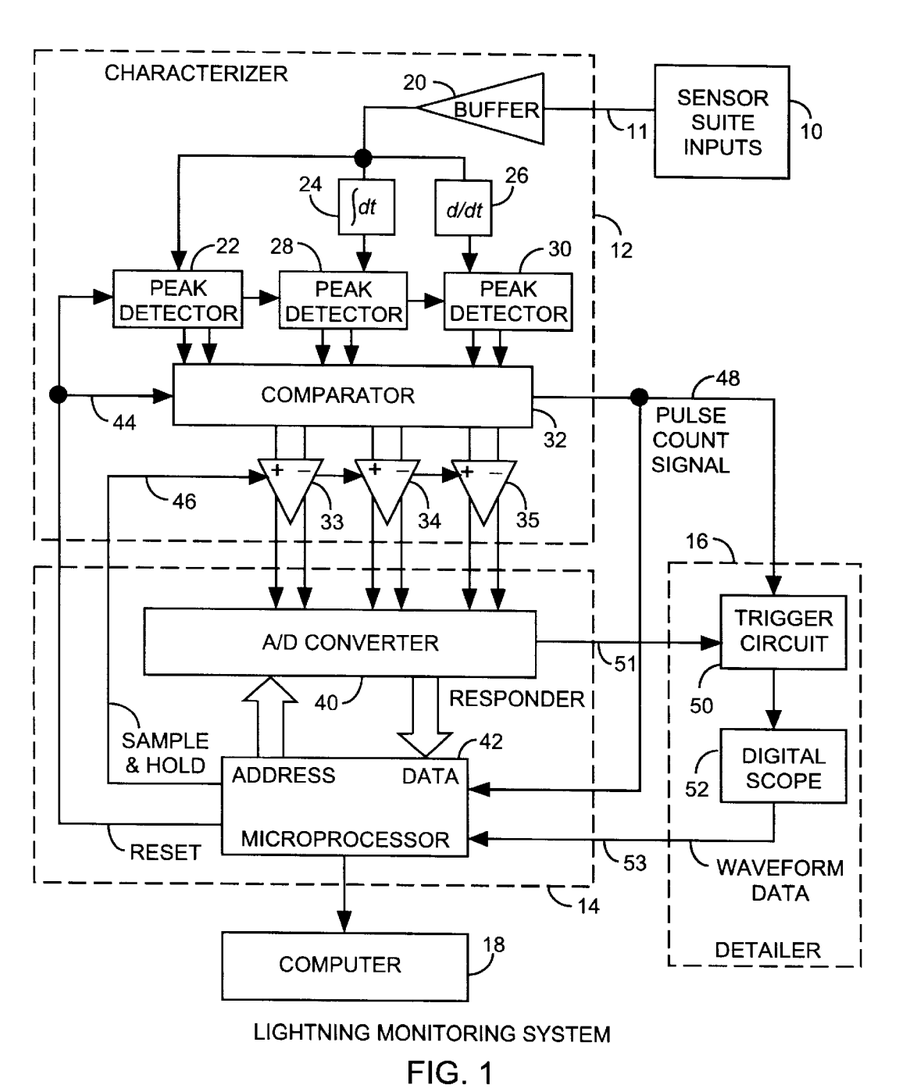
FIG. 1 is a block diagram of the lightning effects monitoring system.

An embodiment of the invention is described with reference to the figures using reference designations as shown in the figures. Referring to FIG. 1, a lightning monitoring system comprises a suite of input sensors 10 providing sensory signals 11 to a characterizer 12 connected to a responder 14 both of which are connected to a detailer 16. These sensors 10 detect the lightning-induced electromagnetic transients and provide the sensory input signals to the lightning monitoring system. The responder 14 communicates with a computer 18 in a control station for reporting analysis results to the users of the system. A retest algorithm can be executed by the computer 18. The retest algorithm utilizes the benefits of the on-line monitoring data for determining stress indexed to strength levels by indices for rapid retest determinations. The retest algorithm reduces the launching of damaged space vehicles and to avoid conducting unnecessary retests. Space vehicle specific information, that is, strength levels and stress curves, can be read in simple (x,y) paired formats and stored in the computer 18.

The sensor suite 10 is a set of multiple sensors including current probe sensors, electric field sensors, and magnetic field sensors and voltage probe sensors. Sensory input signals are received by a buffer 20 communicating the input signals to a first peak amplitude detector 22, an integrator 24, and a differentiator 26 in the characterizer 12. The characterizer 12 includes a plurality of peak detectors 22, 28, and 30. The integrator 24 and the differentiator 26 condition and characterize the sensor signals 11 and communicate respective integrated input signals and differentiated input signal to the respective second peak detector 28 and the respective third peak detector 30. The detectors 22, 28, and 30 provide respective positive and negative peak signals to a comparator 32 providing respective comparator positive and negative outputs to respective sample and hold amplifiers 33, 34, and 35 providing respective positive and negative compared input signals to an analog to digital converter 40 in the responder 14. These characterized sensor signals are then communicated to the responder 14 through the A/D converter 40 to a microprocessor 42 communicating monitored data to the computer 18 executing the retest algorithm. Only those sensor inputs from the buffer 20, integrator 24, and differentiator 26 exceeding a preset threshold will trigger the detailer 16 where these signals will be displayed in suitable forms.

The responder 14 comprises a microprocessor 42 that controls the A/D converter 40 with selecting address signals on address lines and receives converted digital data from A/D converter 40 over data lines. The data lines communicate digital data indicating peak values of the sensor input, integrated input, and differentiated input from the sample and hold amplifiers 33, 34, and 35, respectively. The microprocessor 42 provides a reset signal 44 to the detectors 22, 28, and 30, comparator 32 and provides a sample and hold signal 46 to the sample and hold amplifiers 33, 34, and 35 for controlling the comparison and conversion of the compared signals converted into digital data on the data lines. A sample and hold signal 46 from the microprocessor 42 samples and holds the input signal voltages to the sample and hold amplifiers 33, 34, and 35 for a period of time with a certain droop rate. Once a sample and hold cycle is completed, the microprocessor 42 sends a reset signal 44 to the peak detectors 22, 28, 30, and the comparator 32 to reset the peak detectors and to start a new cycle of detecting, comparing, sampling and holding, and digitizing.

The comparator 32 generates a pulse count signal 48 communicated to the detailer 16. Only those input signals exceeding a preset threshold in the comparator 32 will trigger the detailer 16 and be communicated to the detailer 16 for display. A triggering circuit 50 is triggered by the pulse count signal 48 from the comparator 32 and the digital outputs 51 from the A/D converter 40, routes waveform data from the converter 40 to a digital scope 52 for display. The detailer 16 is used for detailing the positive and negative sensory input signals, integrated input signals and differentiated input signals into suitable forms for storage and display on the digital scope 52. The digitized waveform 53 has digital amplitude valued across a predetermined time period where as the peak value communicated on the data lines to the microprocessor 42 is a single peak amplitude value. The waveform data 53 on the scope 52 will be communicated to the microprocessor 42 for further processing and for later data distribution to the computer 18 in the control station.

Figure 2:
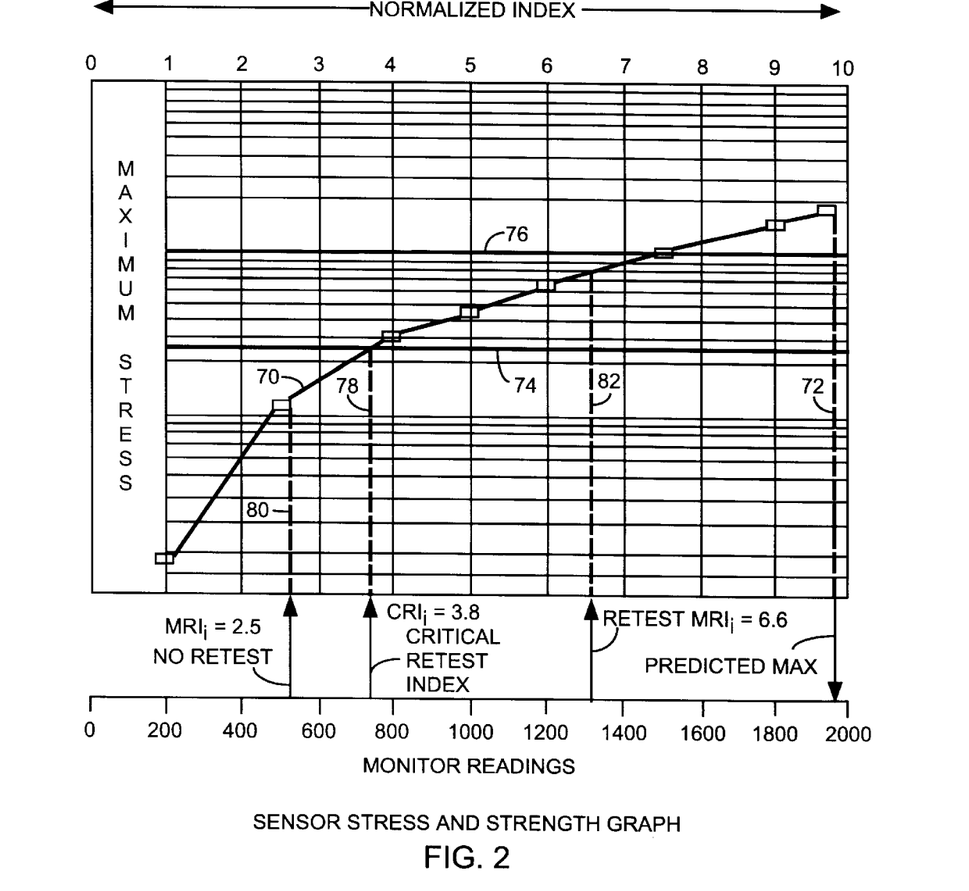
FIG. 2 is a maximum predicted stress and strength energy chart.

Referring to FIG. 2, the retest algorithm is used in connection with stress curve graphs for each respective sensory input in relation to a circuit or device of a target monitored system, each of which may further comprise several subcircuits and subdevices. The sensor stress curve graph includes a stress curve 70 across monitor readings for a respective circuit or device for a respective sensor input normalized by an scalar value to a predicted maximum value 72 of the monitor readings. In the preferred form, the scalar value is ten for a normalized index scale from zero to ten. The stress curve 70 is intersected by a safety margin strength level 74 which is less that an inherent circuit strength level 76 by a safety margin.

Due to the fact that lightning energy can enter the system in different ways, and the fact that the on-line monitoring system will deploy multiple sensors for higher fidelity and correlation, retest indices are generated and used to account for different coupling mechanisms as recorded by multiple sensor readings, and to normalize the reading to stress curves having the same base scale. A selected circuit for each sensor will be assigned a respective critical retest index CRIi value 78 where the stress curve 70 intersects the safety margin strength level 74 for the selected circuit and where i indicates a sensor and a respective selected circuit. During a lightning event, a monitor retest index MRIi is generated for each sensor and compared to a respective CRIi to determine if the event warrants a retest of the circuits. The stress curve graph is used in connection with the operation of the retest algorithm of FIG. 3 and an exemplar mathcad process of FIG. 4.

Figure 3:
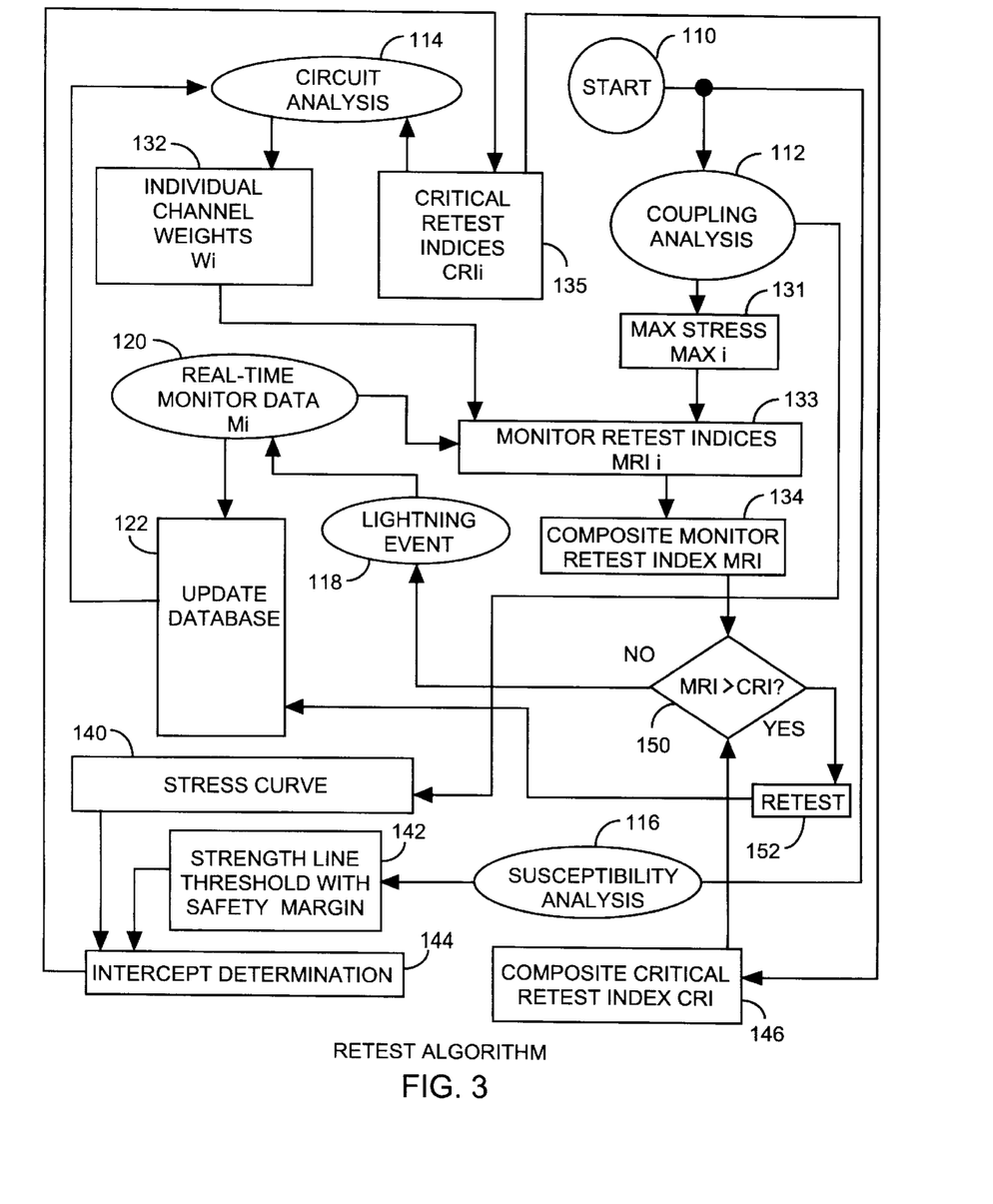
FIG. 3 is a flow chart of the retest algorithm for detecting and evaluating lightning-induced EM effects.
Figure 4:
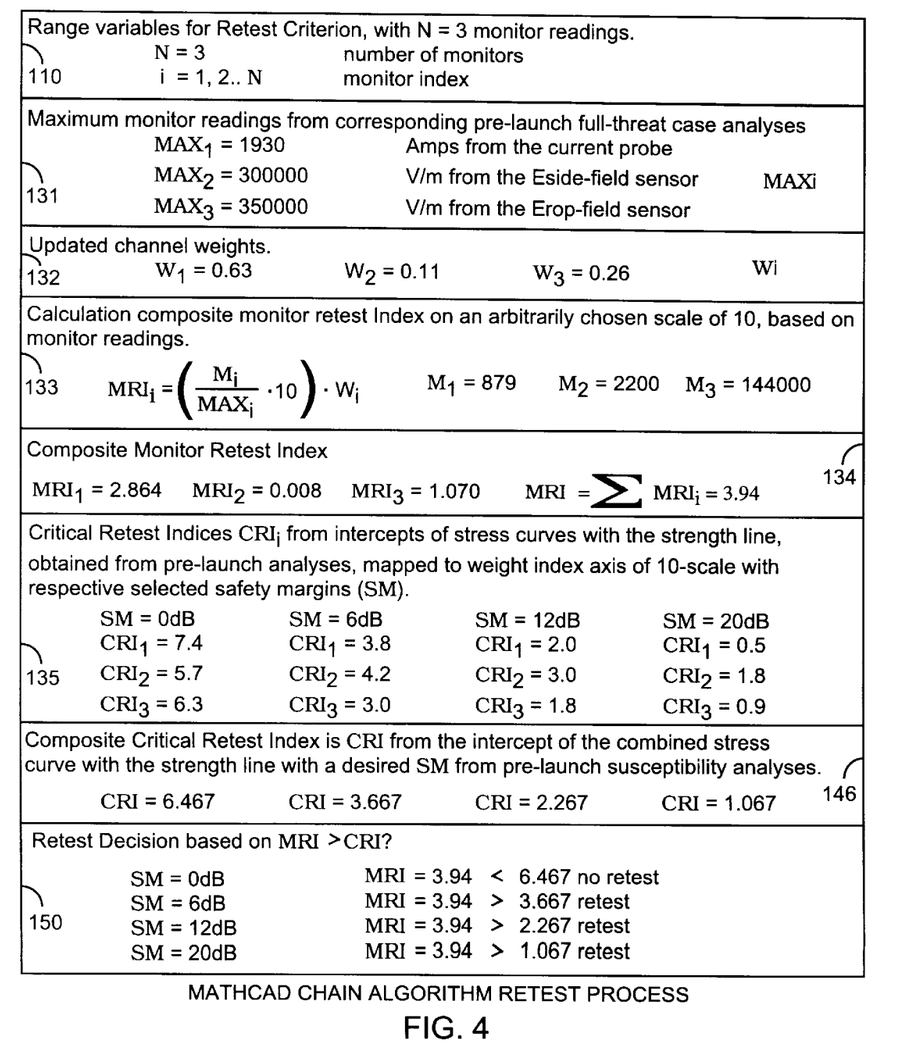
FIG. 4 is a table of a MathCad file for setting retest criterion for applying the retest algorithm.

Referring to all of the Figures, and more particularly to FIGS. 3 and 4, when applying the stress curve for a retest decision, the stress in the x-axis must be the actual stress value as experienced at the selected location. Therefore, an end-to-end calibration and validation of the on-line monitoring system has to be performed at the start 110 before the retest criterion can be used with confidence. As a user logs on to the detection system, the retest algorithm is started 110 by the computer 18. The retest algorithm offers a method to best utilize the full benefits of the on-line monitoring data from the microprocessor 42. A retest criterion is based on reliable data from the on-line measurement system. The retest algorithm is used for reducing the launch of damaged space vehicles into space and avoids conducting unnecessary retests on the ground. As time goes on and more data become available, the lightning retest criteria based on the retest algorithm will dramatically evolve. Any software based on the retest algorithm can complement any other risk assessment procedure. The retest algorithm can also be made to be system-specific by entering specific data such as threshold levels and stress profiles.

At the start 110, the user will be prompted to specify the number N of sensors desired indicated by the sensor index i where i equals one to N. The user may specify sensor placements from a list of recommended locations, and other relevant operational information such as audio alarms and print-out functions. An electromagnetic field coupling analysis 112, a circuit coupling analysis 114, and a susceptivity analysis 116 are performed during pre-launch activities prior to monitoring a lightning event 118. Real time monitor data 120 is used to update database information 122 that is used by the circuit analysis 114 that generates individual channel weights Wi that relate the amount of energy coupled to a receptive circuit from monitor sensory readings from a respective sensor of the sensor suite 10. The on-line monitoring readings 120 can also be used to verify the scattering model in the field coupling analysis 112, to provide increased confidence in the future ability to predict and understand the lightning-induced stress. During the electromagnetic field coupling analysis 114, maximum monitor readings MAXi 131 of the monitor sensor inputs 11 are firstly related to a full-scale lightning threat. During operation, and after a lightning event 118, the real-time monitor data Mi is collected 120 and monitor retest indices MRIi are computed 133 and are used to then compute a composite monitor retest index MRI that indicate monitored stress on the circuits being monitored. Minimal real-time data processing is required to compute the MRIi and composite MRI. The on-line monitoring system database 122 is created to aid in the generation of updated individual channel weights Wi 132 and can be later further dynamically updated in post-launch activities. During the EM-field analysis 112, sensor locations are selected and current densities for magnetic fields and charge densities for electric fields are computed. The weights WI are initially computed as the ratio of the current or charge density for a respective sensor at a respective sensor location divided by the total current or charge densities of all of the sensors. After a lightning event, the weights WI can be dynamically recomputed based on actual measurement data stored in the database 122. The monitor data Mi 120 are used in real-time to calculate 133 the individual monitor retest index MRIi on the arbitrary normalized scaled value from which the composite monitor retest index MRI 134 is computed. The normalization to the factor of ten is somehow arbitrary, yet without loss of generality. The composite monitor index MRI is equal the sum of [scalar x Mi/MAXi]Wi for each indexed sensor.

The coupling analysis 114 is used to generate 140 stress curves 70 for each sensor i of the sensor in suite 10. During the susceptibility analysis 116, inherent strength levels 76 and safety strength levels 74 are generated 142 and intercept points on the stress curves 70 intercepted by the safety strength levels 74 are used to generate 144 individual critical retest indices CRIi 135 that can be used to generate a composite critical retest index CRI 146. The individual sensor channel weights Wi 132 are generated using a lightning channel model in coupling analysis 112 and circuit analyses 114. The individual channel weights Wi and the critical retest indices CRIi 135 can be routinely updated in a dynamic mode with probability and efficiency results from the database 112. The composite monitor retest index MRI 150 is compared to the composite critical retest index CRI 146 to determine if a retest 152 of the circuits is indicated. When a retest 152 is performed, the database 122 can be updated for updating the weights Wi for improving subsequent retest decisions 150 for significant lightning events 118.

The susceptibility analysis 116 and the circuit analyses 114 are performed during pre-launch activities to provide the stress curves 70 and the strength lines 76 and 74 on the stress curve graphs for the respective sensor and circuit. The stress curve 70 is for a respective sensor, such as an exemplar current probe sensor, with and without the safety margin, for example of 6 dB. From the intercepts of the stress curves 70 and the strength line 74 and 76 for the individual critical retest indices CRIi 135 are found. The composite critical retest index is preferably equal to the arithmetic average of the individual critical retest indices CRIi, that is, the CRI is equal to the sum of the individual CRIi derived by N for i equal one to N. The composite index MRI is preferably compared 150 to a composite index CRI as a single comparison to determine if a retest 152 of the circuits is indicated. However, the comparison 150 may also determine if a retest 152 is desirable when any one of the MRIi is greater than the respective CRIi for each of the sensors. Alternatively, a composite stress curve can be generated by averaging all stress curves 70 of all the individual channels i in the circuit analysis 114. Averaging the safety strength levels 74 also provides a composite safety strength level. In this case of generating a composite stress curve 70 and a composite safety strength level 74, the composite critical retest index CRI 135 can then be generated 144 from the intercept on the composite stress curve where intercepted by the composite safety strength level 74. The final decision step in the retest algorithm is the retest decision 150 that is preferably a simple single comparison of the composite MRI and CRI values for indicating if the circuits should be retested. This is especially desirable at the time of a critical usage of the circuits, for example, just before a launch of space vehicle housing containing the monitored circuits.

The weights Wi are dictated by the lightning coupling mechanism and are given by expert analysts based on the circuit analyses and are updated in an evolving dynamic manner as more data are accumulated. Monitoring reading Mi are the actual monitor readings that are continuously updated. MAXi values are predicted maximum monitor reading values for the full-threat case known from pre-launch analyses. Each point on each stress curve is related to a MRII value on the normalized x-axis. The CRIi values can be determined from a stress curve graph having a stress curve 70 intersection by strength levels 74 or 76. The MRIi values can be compared to the respective CRIi value to determine if a particular circuit should be retested.

Referring to all of the Figures and more particularly to FIG. 4, the retest algorithm was applied to a three-sensor suite example using a MathCad program. A current probe sensor and two E-field sensors are positioned relative to the space vehicle. The maximum monitor readings from the full-threat case analysis were found to be maxi=1930 Amps, 300 kV/m and 350 kV/m, respectively. The circuit analyses 114 initially indicated weights of W1 equaling 0.34 for the current probe sensor, and weights W2 and W3 equaling 0.33 for each of E-field sensors. The monitor readings Mi from the on-line monitoring system where M1=879 Amps, M2=2.2 kV/m, and M3=14.4 kV/m, providing individual monitor retest indices of MRI1=1.548, MRI2=0.024, and MRI3=1.358, respectively. These channel weights Wi and monitor retest indices MRIi are used to calculate the composite MRI and CRI with safety margins of 0 dB, 6 dB, 12 dB, and 20 dB. No retest was recommended for safety margins less than 12 dB. For safety margin equal to 12 dB, the composite MRI was slightly larger than composite CRI and the retest recommendation was marginal. After a lightning event and after updating the database 122 using on-line measured data from an actual launch, the weights 132 were updated to be W1=0.63, W2=0.11 and W3=0.26, and the MRIi 133 became M1=2.864, M2=0.008 and M3=1.07 providing a composite MRI 134 of 3.94 which was definitely larger than the composite CRI of 2.27 at the 12 dB safety margin. The retest recommendation with the updated weights was more definite.

For a retest criterion to be an effective tool for real-time decision-making, the decision should be based on a balance between too much and too little retest. The retest algorithm is dynamic in that the database can be updated from various lightning events to accumulate actual data. Small-scale model testing, triggered lightning tests, in-situ measurements and comparison to existing databases can be done. Also, the retest criterion can be verified by injecting known pulses into the algorithm stream, and by monitoring the responsiveness of the retest criterion to various stimuli. As time goes on, and more data on the retests and damage is accumulated, this data can be gradually incorporated into the retest criterion to gain more confidence in the tool for decision-making.

The retest algorithm uses a set of sophisticated analyses and measurements to reduce the retest no-retest decision to a simple comparison of two quantities, the MRI and CRI, based on lightning physics, stress and strength data. An ability to make an instantaneous and well-founded decision can greatly streamline the launch operation, while reducing the risk, which will ultimately result in great long-term cost savings. Many launch directors will desire an immediate and clear-cut decision of a retest or no retest. Most of the inputs to the algorithm can be obtained in pre-launch and post-launch activities. Therefore, only minimal real-time data processing is required. All stress curve and strength information for each sensor channel with safety margins will also be available for examination. The retest algorithm can also be applied separately to sensors monitoring space vehicle circuits as well as to those for launch vehicle circuits, giving each contractor information about the status of the systems. Stress and strength information can also be given to identify particular circuits which are most likely to be damaged. In the special case when there is only one stress available from one monitoring sensor where N equals one, the above retest criterion is still applicable, although with a somewhat reduced level of confidence. Those skilled in the art can make enhancements, improvements, and modifications to enhance the invention. However, those enhancements, improvements, and modifications may nonetheless fall within the spirit and scope of the following claims.

What is claimed is:

1. An evaluation method for determining when a retest of a device in a structure should be performed for lightning damage during a lightning event monitored by a sensor, the method comprising the steps of, determining a maximum stress from a maximum sensor reading of the sensor from a full threat lightning strike proximal to the structure, generating a stress curve for the device indicating a stress upon the device up to the maximum stress, generating a strength level for the device indicating strength of the device to withstand dissipation of energy, determining a critical retest index, normalized to the maximum stress, where the stress curve intercepts the strength level, generating a channel weight for indicating the amount of energy coupled to the device during the lightning event, receiving a monitor reading from the sensor, generating a monitor retest index, normalized to the maximum stress, from the monitor reading and channel weight, and comparing the monitor retest index to the critical retest index to indicate that the device should be retested.

2. An evaluation method for determining when a retest of a plurality of devices in a structure should be performed for lightning damage during a lightning event monitored by a respective plurality of sensors, the method comprising the steps of, determining a plurality of maximum stresses for the plurality of devices from a full threat lightning strike proximal to the structure, generating a respective plurality of stress curves for the plurality of devices indicating respective stresses upon the devices up to the respective plurality of maximum stresses, generating a respective plurality of strength levels for the devices indicating respective strengths of the devices to withstand dissipation of energy, determining a respective plurality of critical retest indices, normalized to the maximum stresses, where the stress curves intercept the strength levels, generating a composite critical retest index form the critical retest indices, generating a respective plurality channel weights for indicating the amount of energy respectively coupled to the devices during the lightning event, receiving a respective plurality of monitor readings from the sensors, generating a respective plurality of monitor retest indices, normalized to the maximum stresses, from the monitor readings and channel weights, generating a composite monitor retest index from the plurality of monitor retest indices, and comparing the composite monitor retest index to the composite critical retest index to indicate that the plurality of devices should be retested.

3. The evaluation method of claim 2 further comprising the steps of, storing the plurality of monitor readings in a database, and recomputing the plurality of channel weights based on the plurality of monitor readings.

4. The evaluation method of claim 2 wherein the plurality of monitor readings are analog monitor readings, the method further comprising the steps of, digitizing the analog monitor readings after receiving the analog monitor readings, and displaying the digitized monitor readings as a waveform over a predetermined time period.

5. The evaluation method of claim 2 wherein the monitor readings are analog monitor readings, the method further comprising the steps of, digitizing the analog monitor readings after receiving the analog monitor readings, and determining when any of the analog monitor readings exceed respective threshold levels.

6. The evaluation method of claim 2 wherein the monitor readings are analog monitor readings, the method further comprising the steps of, digitizing the analog monitor readings after receiving the analog monitor readings, determining when any of the analog monitor readings exceed respective threshold levels, and displaying a peak value of the analog monitor readings.

7. The evaluation method of claim 2 wherein the composite critical retest index is an average of the critical retest indices.

8. The evaluation method of claim 2 wherein, the composite monitor retest index is a sum of the monitor retest indices.

9. An evaluation method for determining when a plurality of devices in a structure should be performed for lightning damage during a lightning event monitored by a respective plurality of sensors, the method comprising the steps of, determining a plurality of maximum stresses for the plurality of devices from a full threat lightning strike proximal to the structure, generating a respective plurality of stress curves, normalized to the maximum stresses, for the plurality of devices indicating respective stresses upon the devices up to the respective maximum stresses, generating a respective plurality strength levels, normalized to the maximum stresses, for the devices indicating respective strengths of the devices to withstand the dissipation of, generating a composite stress curve from the plurality of stress curves, generating a composite strength level form the plurality of strength levels, generating a composite critical retest index form an intercept of the composite stress curve and the composite strength level, generating respective channel weights for indicating the respective amount of energy coupled to the devices during the lightning event, receiving a respective plurality of monitor readings from the sensors, generating a respective plurality of monitor retest indices, normalized to the maximum stresses, from the monitor readings and the channel weights, generating a composite monitor retest index from the plurality of monitor retest indices, and comparing the composite monitor retest index to the composite critical retest index to indicate that the plurality of devices should be retested.

* * * * *